United States Patent
MacMillan (10) Patent No.: US 6,294,959 B1
(45) Date of Patent: Sep. 25, 2001

(54) CIRCUIT THAT OPERATES IN A MANNER SUBSTANTIALLY COMPLEMENTARY TO AN AMPLIFYING DEVICE INCLUDED THEREIN AND APPARATUS INCORPORATING SAME

(76) Inventor: Bruce E. MacMillan, 4527 N. 38th St., Phoenix, AZ (US) 85018

( * ) Notice: Subject to any disclaimer, the term of this patent is extended or adjusted under 35 U.S.C. 154(b) by 0 days.

(21) Appl. No.: 09/438,827

(22) Filed: Nov. 12, 1999

(51) Int. Cl.$^7$ ................................................ H03F 3/16
(52) U.S. Cl. ...................................... 330/277; 330/296
(58) Field of Search ................................. 330/277, 296, 330/300, 256, 263

(56) References Cited

U.S. PATENT DOCUMENTS

| | | | |
|---|---|---|---|
| 3,872,390 | * 3/1975 | Nash | 330/13 |
| 4,069,431 | * 1/1978 | Kucharewski | 307/355 |
| 4,233,528 | 11/1980 | Hogeboom | 307/353 |
| 4,246,498 | 1/1981 | Asano | 307/270 |
| 4,490,634 | 12/1984 | Hareyama | 307/573 |
| 4,645,951 | 2/1987 | Uragami | 307/446 |
| 4,841,172 | 6/1989 | Ueno et al. | 307/443 |
| 4,874,971 | 10/1989 | Fletcher | 307/605 |
| 4,912,339 | 3/1990 | Bechade et al. | 307/243 |
| 4,912,430 | * 3/1990 | Frank | 330/277 |
| 4,996,446 | 2/1991 | Nakada | 307/296.2 |
| 5,006,732 | 4/1991 | Nakamura | 307/473 |
| 5,055,705 | 10/1991 | Hall | 307/296.4 |
| 5,068,548 | 11/1991 | El Gamel | 307/446 |
| 5,144,164 | 9/1992 | Sugimoto et al. | 307/446 |
| 5,289,062 | 2/1994 | Wyland | 307/577 |
| 5,338,977 | 8/1994 | Carobolante | 307/270 |
| 5,361,004 | 11/1994 | Hirschauer | 326/70 |
| 5,382,846 | 1/1995 | Shigehara et al. | 326/68 |
| 5,399,920 | 3/1995 | Van Tran | 326/83 |
| 5,444,410 | 8/1995 | Polhemus | 327/317 |
| 5,446,413 | * 8/1995 | Loeppert et al. | 330/277 |
| 5,475,331 | 12/1995 | Bult et al. | 327/427 |
| 5,552,746 | 9/1996 | Danstrom | 327/427 |
| 5,557,223 | 9/1996 | Kuo | 327/108 |
| 5,587,667 | 12/1996 | Inami et al. | 326/17 |
| 5,594,369 | 1/1997 | Randoh et al. | 326/83 |
| 5,594,380 | 1/1997 | Nam | 327/390 |
| 5,619,150 | 4/1997 | Briner | 327/55 |
| 5,631,608 | 5/1997 | Pleitz | 330/255 |
| 5,783,970 | 7/1998 | Pleitz | 330/269 |
| 5,793,237 | 8/1998 | Martin | 327/227 |
| 5,818,259 | 10/1998 | Martin | 326/84 |
| 5,867,042 | 2/1999 | Briner | 327/55 |

OTHER PUBLICATIONS

General Electric Transistor Manual, Chapter 11, p. 263 No month and no year.

* cited by examiner

Primary Examiner—Robert Pascal
Assistant Examiner—Henry Choe
(74) Attorney, Agent, or Firm—Holland & Knight LLP (57) ABSTRACT

A circuit (200) includes a four-terminal voltage controlled voltage source (VCVS, 201) coupled to a three-terminal amplifying device (203), whereby when an input signal is applied to a negative input terminal (205) of the VCVS (201), the circuit (200) operates in a manner substantially complementary to the amplifying device (203). Such a circuit (200) may be considered a "virtual" three-terminal amplifying device and may be beneficially coupled in a complementary manner with another three-terminal amplifying device that is substantially identical to the three-terminal amplifying device (203) included in the circuit (200) to form a composite amplifier circuit (e.g., 407) that achieves intended performance over varying operating conditions.

24 Claims, 4 Drawing Sheets

CIRCUIT THAT OPERATES IN A MANNER SUBSTANTIALLY COMPLEMENTARY TO AN AMPLIFYING DEVICE INCLUDED THEREIN AND APPARATUS INCORPORATING SAME

FIELD OF THE INVENTION

The invention relates generally to circuits that operate in a manner substantially complementary to amplifying devices they include, and to apparatuses, such as power amplifiers and stereo receivers, that incorporate such circuits. More particularly, the present invention relates to such a complementary-operating circuit that maintains its complementary operation over varying operating conditions.

BACKGROUND OF THE INVENTION

As is known, some circuit applications, such as audio amplifier applications, prefer or require active devices that are electrical complements of each other. For example, in audio amplifier applications that use vertical double-diffused metal oxide semiconductor field effect transistors (DMOS FETs), P-channel MOSFETs are coupled to their electrical complements, N-channel MOSFETs, to create a composite vertical DMOS device that provides a desired amplification of an audio input signal. However, as is also known, P-channel MOSFETs do not perform as well as N-channel MOSFETs and are more expensive to fabricate and purchase for comparable performance. The inferiority of P-channel MOSFETs is primarily due to inherent differences in N-type and P-type silicon. Consequently, a P-channel MOSFET that is a true electrical complement of an N-channel MOSFET cannot be made using current technology.

Instead of attempting to fabricate a P-channel MOSFET that is a true electrical complement of an N-channel MOSFET, semiconductor manufacturers attempt to match certain parameters of the P-channel and N-channel devices. However, matching of any two parameters of N-channel and P-channel devices causes other parameters of the devices to differ. For example, for the same voltage and current ratings, a P-channel MOSFET will have a higher on-state saturation resistance and a lower transconductance than a similar-sized N-channel MOSFET. To produce a P-channel device that has the same on-state saturation resistance and voltage rating as a particular N-channel device, the silicon die of the P-channel device must be larger than the silicon die of the corresponding N-channel device and, therefore, the P-channel device will cost more than the comparable N-channel device.

Figure 1:
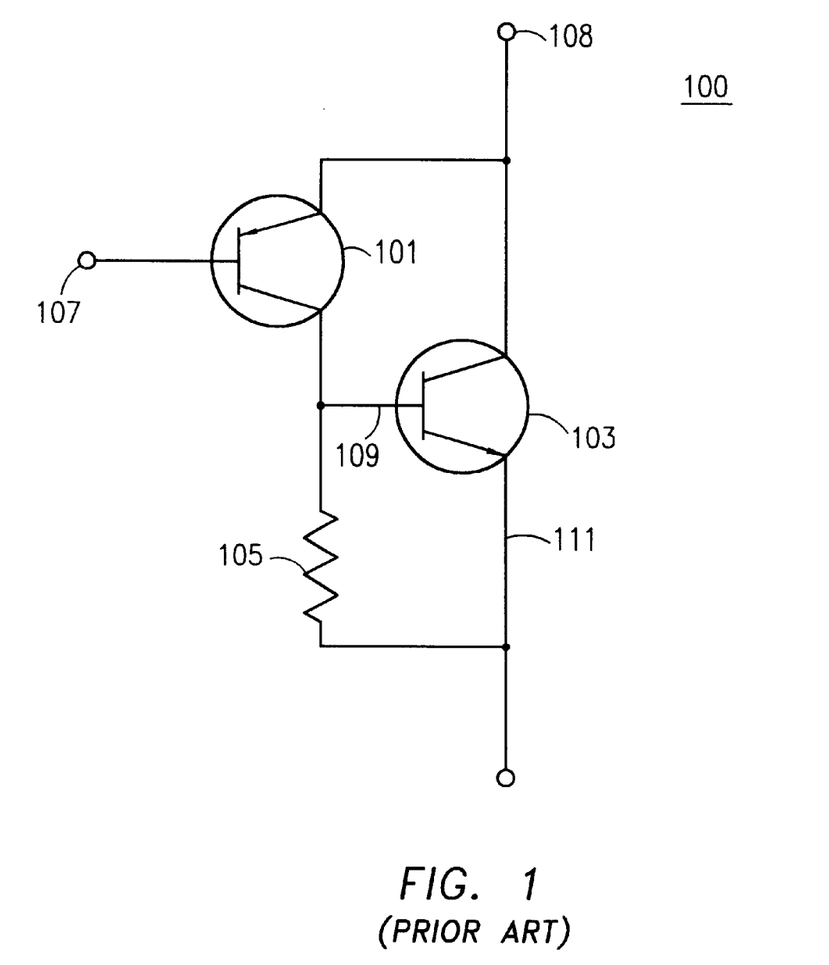
FIG. 1 is a schematic diagram of a prior art circuit that operates in a a manner substantially complementary to an NPN bipolar junction transistor.

Some techniques for producing substantially complementary active devices are also known. For example, until the 1970's, PNP bipolar junction power transistors with performance similar to NPN bipolar junction power transistors were not available. To simulate the function of a PNP power transistor, an NPN power transistor 103 was used with a feedback circuit as depicted in FIG. 1. The feedback circuit consists of a low power PNP transistor 101 and a resistor 105. The combination of the NPN power transistor 103 and the feedback circuit provides an approximately "virtual" PNP transistor circuit 100 and is typically referred to as a "quasi-complementary" circuit. The common application of the virtual PNP transistor circuit 100 was in the output stage of a power amplifier.

Although the virtual PNP transistor circuit 100 provides some complementary operation, it has certain drawbacks. For example, it is difficult to select PNP and NPN transistors 101, 103 for use in the virtual PNP transistor circuit 100 such that the respective direct current (DC) characteristics of the transistors 101, 103 combine to provide a circuit with DC characteristics that are substantially complementary to the DC characteristics of the NPN power transistor 103. Further, variation of the DC characteristics of the NPN power transistor 103, particularly current gain, with varying operating conditions causes the dynamic characteristics of the virtual PNP transistor circuit 100 to deviate from the dynamic characteristics of a true complement of the NPN power transistor 103.

Therefore, a need exists for a circuit that operates in a manner substantially complementary to an amplifying device included therein that can cost-effectively simulate a P-channel MOSFET for use in complementary MOSFET circuit applications and that can maintain complementary operation over varying operating conditions. An apparatus, such as an audio power amplifier or a stereo receiver, that incorporates such a circuit would also be an improvement over the prior art.

SUMMARY OF THE INVENTION

The present invention overcomes the foregoing problems and limitations of the prior art by providing, according to one aspect thereof, a circuit that includes a voltage controlled voltage source (VCVS) coupled to a three-terminal amplifying device, whereby when an input signal is applied to a negative input terminal of the VCVS, the circuit operates in a manner substantially complementary to the amplifying device. Prior art complementary-operating circuits that do not include a VCVS do not maintain their complementary operation over varying operating conditions. By contrast, the use of a VCVS in the circuit of the present invention enables the circuit to operate in a manner substantially complementary to the amplifying device over all specified operating conditions.

According to another aspect of the present invention, the VCVS includes a differential amplifier, a signal translation amplifier, and an amplifying device driver circuit, each of which preferably includes one or more bipolar junction transistors (BJTs) in sharp contrast to the single PNP BJT driver circuit employed in the prior art. The preferred arrangement of BJTs in the differential amplifier, the signal translation amplifier, and the amplifying device driver circuit enables the VCVS to maintain a desired voltage gain (preferably unity) over all specified operating conditions.

According to yet another aspect of the present invention, the aforesaid complementary-operating circuit forms part of a power amplifier and/or a stereo receiver to enhance the overall performance of such stereo components.

These and other aspects and advantages of the invention will become more apparent to a person of ordinary skill in the art upon review of the following detailed description of a preferred embodiment taken in conjunction with the appended drawings in which like reference numerals designate like items.

DETAILED DESCRIPTION OF A PREFERRED EMBODIMENT

Figure 2:
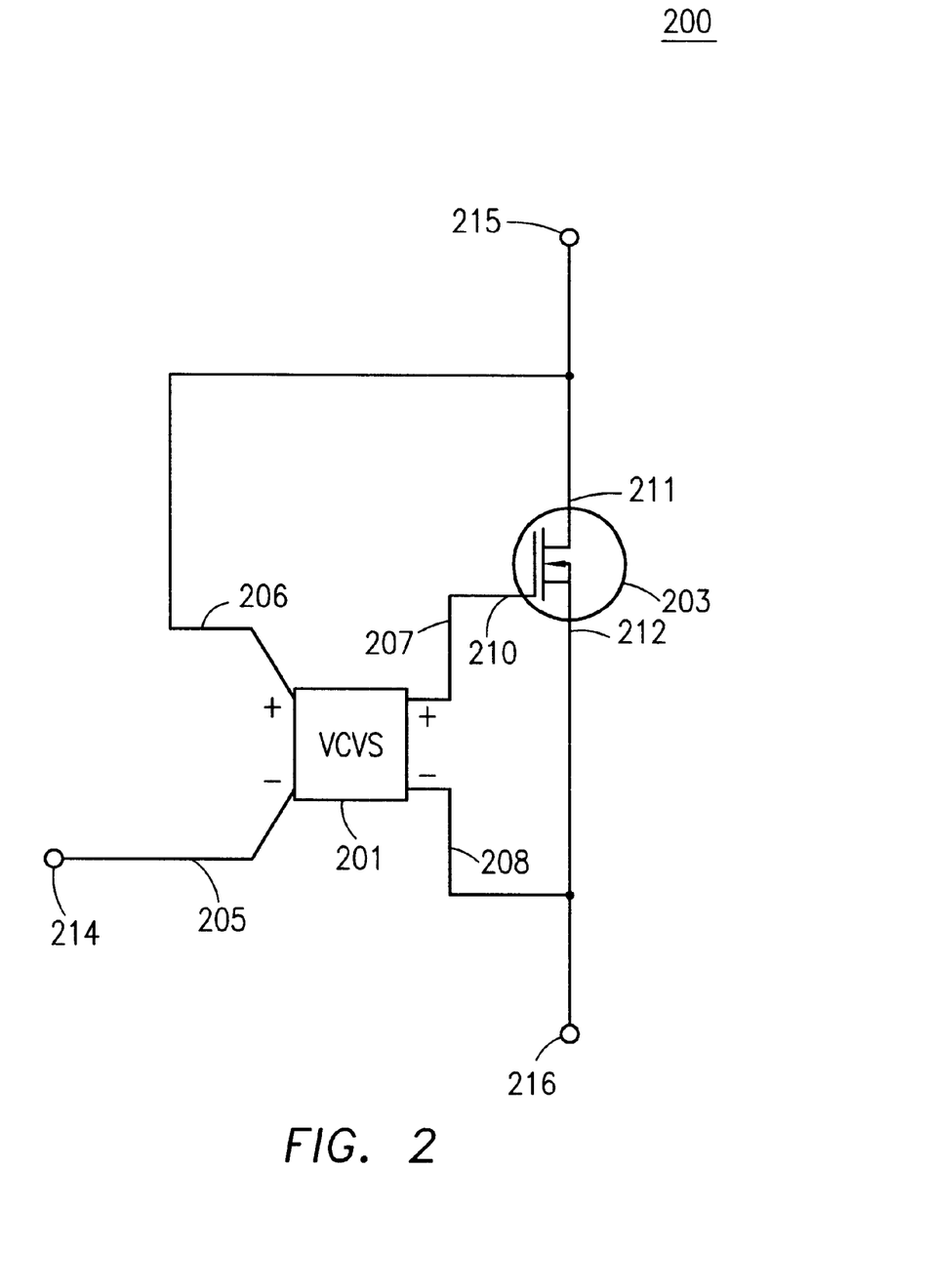
FIG. 2 is a high-level schematic diagram of a circuit that operates in a manner substantially complementary to a three-terminal amplifying device in accordance with the present invention.

FIG. 2 is a high-level schematic diagram of a circuit 200 that operates in a manner substantially complementary to a three-terminal amplifying device 203 in accordance with the present invention. The circuit 200 includes a four-terminal voltage controlled voltage source (VCVS) 201 and the amplifying device 203. The VCVS 201 includes a negative input terminal 205, a positive input terminal 206, a positive output terminal 207, and a negative output terminal 208. The VCVS 201 preferably has a voltage gain of unity or approximately unity (e.g., in the range of 0.9 to 1.1); however, other voltage gains may be alternatively utilized. The preferred implementation of the VCVS 201 is described below with respect to FIG. 3.

The amplifying device 203 preferably comprises an N-channel enhancement-type metal oxide field effect transistor (MOSFET) and, therefore, preferably includes a gate terminal 210, a drain terminal 211, and a source terminal 212. As depicted, the positive input terminal 206 of the VCVS 201 is coupled to the drain terminal 211 of the amplifying device 203, the positive output terminal 207 of the VCVS 201 is coupled to the gate terminal 210 of the amplifying device 203, and the negative output terminal 208 of the VCVS 201 is coupled to the source terminal 212 of the amplifying device 203. In an alternative embodiment, the amplifying device 203 might comprise an insulated gate bipolar transistor (IGBT), a vacuum tube, or a bipolar junction transistor (BJT). However, the benefits of the present invention are most readily apparent when the amplifying device 203 comprises a device with a relatively high input impedance (e.g., a MOSFET, an IGBT, or a vacuum tube).

The circuit 200 operates in a manner substantially complementary to the amplifying device 203 and, therefore, functions as a "virtual" amplifying device itself. That is, the circuit 200 functions as a three-terminal amplifying device and can be used in various applications (e.g., in a power amplifier) as an amplifying device. The three terminals of the virtual amplifying device represented by the circuit 200 are denoted by reference numerals 214–216.

When the amplifying device 203 is an N-channel enhancement-type MOSFET as in the preferred embodiment, the circuit 200 functions as a virtual P-channel enhancement-type MOSFET (i.e., in a manner substantially similar to a P-channel enhancement-type MOSFET and, therefore, substantially complementary to the N-channel enhancement-type MOSFET 203). Accordingly, in the preferred embodiment, the gate terminal of the virtual P-channel MOSFET corresponds to terminal 214 of the circuit 200 (which is equivalent to the negative input terminal 205 of the VCVS 201), the source terminal of the virtual P-channel MOSFET corresponds to terminal 215 of the circuit 200 (which is equivalent to the positive input terminal 206 of the VCVS 201 and the drain terminal 211 of the amplifying device 203), and the drain terminal of the virtual P-channel MOSFET corresponds to terminal 216 of the circuit 200 (which is equivalent to the negative output terminal 208 of the VCVS 201 and the source terminal 212 of the amplifying device 203).

The preferred circuit 200, which as discussed above includes a unity gain VCVS 201 and an N-channel enhancement-type MOSFET 203, operates substantially as follows in accordance with the present invention. Due to the unity gain of the preferred VCVS 201, an input voltage applied across the input terminals 205, 206 of the VCVS 201 results in a substantially identical voltage across the output terminals 207, 208 and, therefore, between the gate terminal 210 and the source terminal 212 of the N-channel MOSFET 203. The application of the input voltage to the input terminals 205, 206 of the VCVS 201 causes a current to flow into the drain 211 and out of the source 212 of the N-channel MOSFET 203.

Since the positive input terminal 206 of the VCVS 201 is connected to the drain terminal 211 of the N-channel MOSFET 203, the current flow into the drain 211 and out of the source 212 of the N-channel MOSFET 203 is controlled by the voltage between the negative input terminal 205 of the VCVS 201 (gate terminal 214 of the virtual P-channel MOSFET) and the drain terminal 211 of the N-channel MOSFET 203 (source terminal 216 of the virtual P-channel MOSFET). This current is also the current flowing into the source 215 and out of the drain 216 of the virtual P-channel MOSFET. In addition, since the voltage gain of the VCVS 201 is unity, the voltage between the gate 210 and the source 212 of the N-channel MOSFET 203 is substantially identical to the voltage between the negative input terminal 205 and the positive input terminal 206 of the VCVS 201. As is known, current flows into the drain and out of the source of an N-channel enhancement-type MOSFET. By contrast, as is also known, current flows into the source and out of the drain of a P-channel enhancement-type MOSFET. Therefore, with the circuit configuration depicted in FIG. 2, application of an appropriate input voltage between the negative input terminal 205 of the VCVS 201 and the drain terminal 211 of the N-channel MOSFET 203 results in current flow in the circuit 200 that is typical of the current flow in a P-channel MOSFET (i.e., into the source terminal 215 and out of the drain terminal 216). Accordingly, the circuit 200 functions in a manner substantially similar to a P-channel enhancement-type MOSFET and, therefore, substantially complementary to operation of the N-channel enhancement-type MOSFET 203 used in the circuit's implementation.

Figure 3:
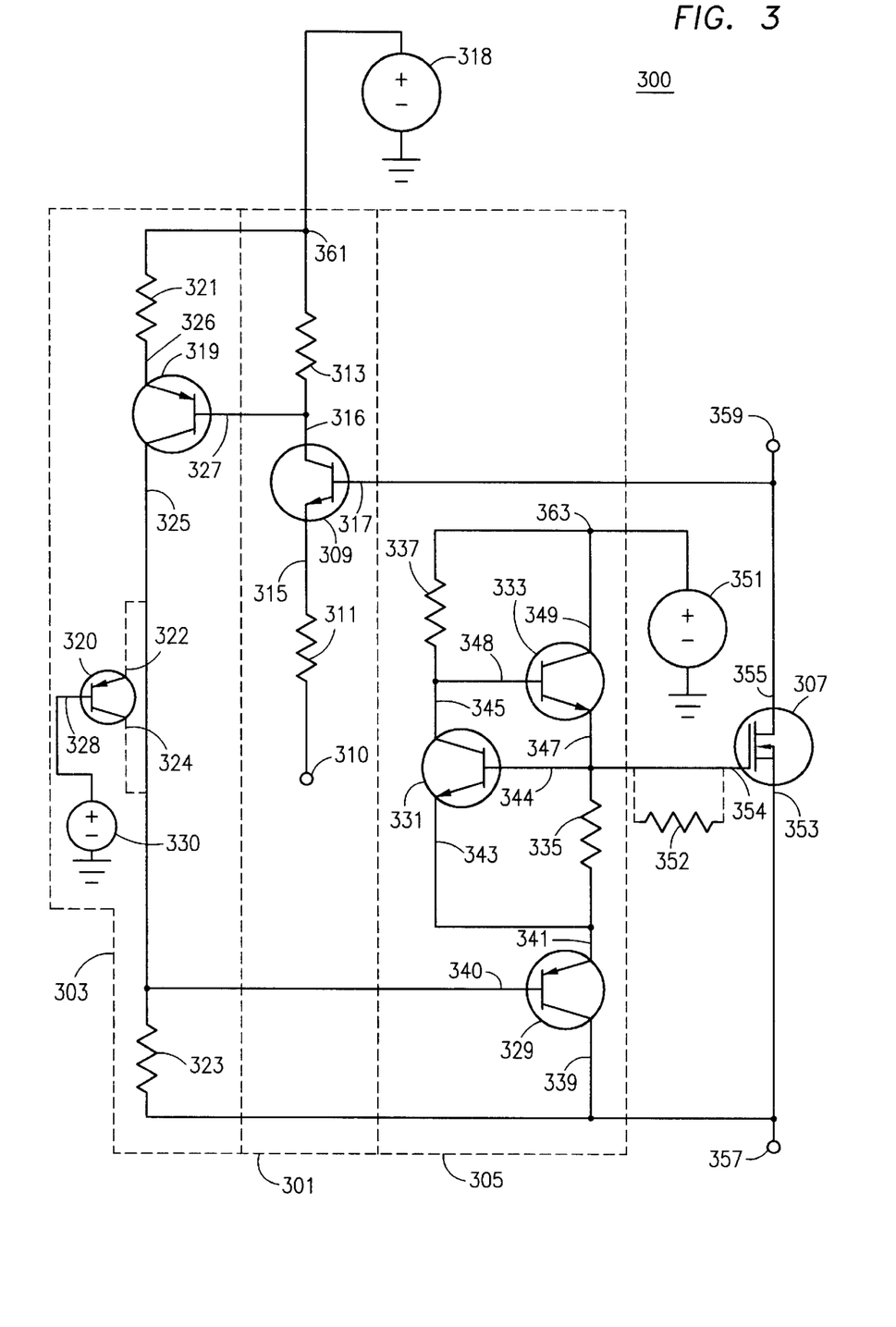
FIG. 3 is a low-level schematic diagram of a circuit that operates in a manner substantially complementary to a three-terminal amplifying device in accordance with a preferred embodiment of the present invention.

FIG. 3 is a low-level schematic diagram of a circuit 300 that operates in a manner substantially complementary to a three-terminal amplifying device 307 in accordance with a preferred embodiment of the present invention. The circuit 300 of FIG. 3 includes a VCVS and an amplifying device as does the circuit 200 of FIG. 2; however, in this embodiment, the VCVS is implemented through a preferred interconnection of a differential amplifier 301, a signal translation amplifier 303, and an amplifying device driver circuit 305. As in the circuit 200 of FIG. 2, the amplifying device 307 of FIG. 3 preferably comprises an N-channel enhancement-type MOSFET. Thus, similar to the circuit 200 of FIG. 2, the circuit 300 of FIG. 3 functions in a manner similar to a P-channel enhancement-type MOSFET and, therefore, is referred to herein as a "virtual P-channel MOSFET." However, although the description provided herein focuses primarily on circuits 200, 300 that function in a manner substantially complementary to N-channel enhancement-type MOSFET amplifying devices 203, 307, the complementing techniques described herein are also readily applicable to other types of amplifying devices, including, but not limited to, vacuum tubes, IGBTs, N-channel or P-channel depletion-type MOSFETs, P-channel enhancement-type MOSFETs, and BJTs.

As shown, the preferred differential amplifier 301 includes an NPN bipolar junction transistor 309 and two resistors 311, 313. One end of resistor 311 is connected to the emitter terminal 315 of NPN transistor 309 and the other end of resistor 311 corresponds to one input terminal of the differential amplifier 301, the negative input terminal of the VCVS, and the gate terminal 310 of the virtual P-channel enhancement-type MOSFET implemented by the circuit 300. The base terminal 317 of NPN transistor 309 is coupled to the drain terminal 355 of the N-channel MOSFET 307 and corresponds to the other input terminal of the differential amplifier 301, the positive input terminal of the VCVS, and the source terminal 359 of the virtual P-channel enhancement-type MOSFET implemented by the circuit 300. The collector terminal 316 of NPN transistor 309 is connected to one end of resistor 313 and corresponds to the output terminal of the differential amplifier 301. The other end of resistor 313 is connected to direct current (DC) voltage source 318.

The output terminal of the differential amplifier 301 (i.e., collector terminal 316) is connected to the input terminal of the signal translation amplifier 303. The signal translation amplifier 303 preferably includes a PNP bipolar junction transistor 319 and two resistors 321, 323. The input terminal of the signal translation amplifier 303 corresponds to the base terminal 327 of PNP transistor 319. The emitter terminal 326 of PNP transistor 319 is connected to one end of resistor 321. The other end of resistor 321 is coupled to DC voltage source 318. The collector terminal 325 of PNP transistor 319 forms the output terminal of the signal translation amplifier 303 and is connected to one end of resistor 323. The other end of resistor 323 forms the negative output terminal of the VCVS and is connected to the source terminal 353 of the N-channel MOSFET 307, which corresponds to the drain terminal 357 of the virtual P-channel MOSFET implemented by the circuit 300.

In an alternative high power embodiment in which the power dissipation capability of PNP transistor 319 is insufficient, the signal translation amplifier might further include a second PNP transistor 320 in series with PNP transistor 319 to effectively form a cascode amplifier stage in which a common emitter stage (PNP transistor 319) drives a common base stage (PNP transistor 320). In this embodiment, the collector terminal of transistor 319 is connected to the emitter terminal 322 of PNP transistor 320 and the collector terminal 324 of PNP transistor 320 is connected to resistor 323. Thus, in this embodiment, the collector terminal 324 of PNP transistor 320 forms the output terminal of the signal translation amplifier 303. The base terminal 328 of PNP transistor 320 is connected to DC voltage source 330. The primary purpose for including PNP transistor 320 in the signal translation amplifier 303 is to reduce the power dissipation in PNP transistor 319. Consequently, inclusion of PNP transistor 320 is optional based on power dissipation requirements of PNP transistor 319.

The output terminal of the signal translation amplifier 303 (i.e., collector terminal 325 or alternatively collector terminal 324) is connected to the input terminal of the amplifying device driver circuit 305. The amplifying device driver circuit 305 preferably includes a PNP bipolar junction transistor 329, two NPN bipolar junction transistors 331, 333 and two resistors 335, 337. The input terminal of the amplifying device driver circuit 305 corresponds to the base terminal 340 of PNP transistor 329. The collector terminal 339 of PNP transistor 329, which forms a first output terminal of the amplifying device driver circuit 305 and the negative output terminal of the VCVS, is connected to one end of resistor 323 and to the source terminal 353 of the N-channel MOSFET 307, which corresponds to the drain terminal 357 of the virtual P-channel MOSFET implemented by the circuit 300. The emitter terminal 341 of PNP transistor 329 is connected to one end of resistor 335 and to the emitter terminal 343 of NPN transistor 331. The other end of resistor 335 is connected to the base terminal 344 of NPN transistor 331 and to the emitter terminal 347 of NPN transistor 333 to collectively form a second output terminal of the amplifying device driver circuit 305 and the positive output terminal of the VCVS.

The collector terminal 345 of NPN transistor 331 is connected to the base terminal 348 of NPN transistor 333 and to one end of resistor 337. The other end of resistor 337 is connected to the collector terminal 349 of NPN transistor 333 and to DC voltage source 351. As discussed above, the emitter terminal 347 of NPN transistor 333 is the second output terminal of the amplifying device driver circuit 305 and is connected to the gate terminal 354 of the N-channel MOSFET 307. In an alternative embodiment, a resistor 352 may be added between the second output terminal of the amplifying device driver circuit 305 and the gate terminal 354 of the N-channel MOSFET 307 as shown in dash in FIG. 3. Inclusion of such a resistor 352 serves to decrease circuit bandwidth and reduce parasitic oscillations of the N-channel MOSFET 307.

The voltages of DC voltage sources 318, 330, 351 are dependent upon the output voltage range of an application circuit, such as an audio amplifier circuit, that includes circuit 300. In a preferred embodiment, the voltage of DC voltage source 318 is approximately forty-five (45) volts, the voltages of DC voltage sources 330 and 351 are zero (0) volts or ground potential, and a DC voltage of approximately negative thirty (−30) volts is applied to the drain terminal 357 of the virtual P-channel MOSFET to allow the voltage at the source terminal 359 of the virtual P-channel MOSFET to remain within the voltage range of negative thirty (−30) volts to positive thirty (+30) volts with respect to ground.

Operation of the circuit 300 occurs substantially as follows in accordance with the preferred embodiment of the present invention. Generally, the potential difference between the gate terminal 310 and the source terminal 359 of the virtual P-channel MOSFET is amplified by the differential amplifier 301. The output of the differential amplifier 301 supplies the input to the signal translation amplifier 303. The output of the signal translation amplifier 303 supplies the input to the amplifying device driver circuit 305. The output of the amplifying device driver circuit 305 is a voltage between the gate terminal 354 and the source terminal 353 of the N-channel MOSFET 307. In the preferred embodiment, the differential amplifier 301, the signal translation amplifier 303, and the amplifying device driver circuit 305 all have voltage gains of approximately one (unity), such that the net voltage gain from the VCVS input (i.e., between the gate terminal 310 and the source terminal 359 of the virtual P-channel MOSFET) to the VCVS output (i.e., between the gate terminal 354 and the source terminal 353 of the N-channel MOSFET 307) is also approximately one (e.g., in the range of 0.9 to 1.1).

The input potential difference between the base terminal 317 of NPN transistor 309 (i.e., virtual P-channel MOSFET source terminal 359) and the virtual P-channel MOSFET gate terminal 310, less the base-emitter junction forward voltage drop of NPN transistor 309, appears across resistor 311 causing an emitter current to flow from the emitter terminal 315 of NPN transistor 309. The collector current of NPN transistor 309, which as is known is approximately equal to the emitter current, flows through resistor 313. The nominal value of resistor 313 is chosen to be equal to the nominal value of resistor 311, thus the voltage across resistor 313 is approximately equal to the voltage across resistor 311. The voltage across resistor 313 is the output voltage of the differential amplifier 301.

The voltage across resistor 313 (i.e., the output voltage of the differential amplifier 301) appears across resistor 321 less the emitter-base junction forward voltage drop of PNP transistor 319, thereby establishing an emitter current in PNP transistor 319. The collector current of PNP transistor 319, which as is known is approximately equal to its emitter current, flows through resistor 323. The nominal value of resistor 323 is chosen to be equal to the nominal value of resistor 321, thus the voltage across resistor 323 is approximately equal to the voltage across resistor 321. The voltage across resistor 323 is the output of the signal translation amplifier 303.

The voltage across resistor 323 (i.e., the output voltage of the signal translation amplifier 303) appears across the base-collector junction of PNP transistor 329. PNP transistor 329 is a common-collector amplifier which has a voltage gain of approximately one and serves to buffer the output voltage of the signal translation amplifier 303. To properly drive the capacitive load presented to the amplifying device driver circuit 305 by the input of the N-channel MOSFET 307, the amplifying device driver circuit 305 must be able to both sink and source current. Sinking of output current of driver circuit 305 is performed by PNP transistor 329; whereas, sourcing of output current of driver circuit 305 is performed by NPN transistor 333 preferably in a common-collector amplifier configuration.

The input voltage of NPN transistor 333 is derived from the emitter current of PNP transistor 329 flowing through a biasing arrangement that includes NPN transistor 331. Current flowing through resistor 337 provides a forward bias voltage to the base terminal 348 of NPN transistor 333 which causes emitter current to flow from NPN transistor 333 through resistor 335 into the emitter terminal 341 of PNP transistor 329. The emitter current of PNP transistor 329 is limited to a maximum value by the operation of NPN transistor 331. That is, the voltage drop across resistor 335 forward-biases the base-emitter junction of NPN transistor 331, which in turn causes a collector current to flow in NPN transistor 331, thereby limiting the base voltage of NPN transistor 333 to a value which causes one PN junction forward-voltage drop (about 0.4–0.8 volts) across resistor 335.

The positive output terminal of the amplifying device driver circuit 305 is the junction of the base terminal 344 of NPN transistor 331 and the emitter terminal 347 of NPN transistor 333. The voltage at the emitter terminal 341 of PNP transistor 329 is one emitter-base forward voltage drop (about 0.4–0.8 volts) more positive than the output voltage of the signal translation amplifier 303. Since the base-emitter junction of NPN transistor 331 is normally forward-biased, the output voltage of the amplifying device driver circuit 305 is two junction forward-voltage drops (about 0.8–1.6 volts) more positive than the output voltage of the signal translation amplifier 303. Given that these two PN junction forward-voltage drops add to the output voltage from the signal translation amplifier 303, they serve to cancel the voltages lost in the differential amplifier 301 and the signal translation amplifier 303 due to base-emitter junction forward-voltage drops of NPN transistor 309 and PNP transistor 319. With such lost voltage cancellation, the output voltage presented between the gate terminal 354 and the source terminal 353 of the N-channel MOSFET 307 is approximately the same as the voltage that appears between the gate terminal 310 and the source terminal 359 of the virtual P-channel MOSFET implemented by the circuit 300.

If the load impedance presented to the output of the amplifying device driver circuit 305 were infinite, the current through PNP transistor 329 and NPN transistor 333 would be constant. However, since the actual load impedance presented to the output of the amplifying device driver circuit 305 by the input of the N-channel MOSFET 307 is capacitive rather than infinite, the current through PNP transistor 329 and NPN transistor 333 varies as a function of time. During time periods when the instantaneous output current of the amplifying device driver circuit 305 is negative, PNP transistor 329 sinks current through the parallel combination of resistor 335 and the base-emitter junction of NPN transistor 331, and the emitter current of NPN transistor 333 is less than its respective quiescent value. During time periods when the instantaneous output current of the amplifying device driver circuit 305 is positive, NPN transistor 333 sources output current and has an emitter current that is greater than its respective quiescent value.

The emitter current of NPN transistor 333 is the sum of the current flowing into resistor 335 and the output current of the amplifying device driver circuit 305 during time periods when the instantaneous output current of the amplifying device driver circuit 305 is positive (referred to herein as "positive output current"). Positive output current (sourcing) tends to reduce the current flow through resistor 335 and accordingly the voltage drop across resistor 335, thereby reducing the forward bias voltage of the base-emitter junction of NPN transistor 331. The reduction in forward bias voltage of the base-emitter junction of NPN transistor 331 reduces the collector current of NPN transistor 331 and allows greater forward bias voltage to be applied to the base terminal 348 of NPN transistor 333, thereby increasing the emitter current of NPN transistor 333. Output current of the amplifying device driver circuit 305 during time periods when the instantaneous value of such output current is negative (referred to herein as "negative output current") tends to increase the current flow through resistor 335 and accordingly the voltage drop across resistor 335, thereby increasing the forward bias voltage of the base-emitter junction of NPN transistor 331. The increase in forward bias voltage of the base-emitter junction of NPN transistor 331 increases the collector current of NPN transistor 331 and reduces the forward bias voltage applied to the base terminal 348 of NPN transistor 333, thereby reducing the emitter current of NPN transistor 333. If the negative output current exceeds the quiescent current of PNP transistor 329, NPN transistor 331 will be saturated with a collector-emitter voltage of essentially zero and NPN transistor 333 will have effectively no emitter current.

In order for the circuit 300 to operate optimally, some limits on circuit voltages should be observed. First, NPN transistor 317 should be kept from saturating. This requirement constrains the voltage at node 361 to be, under all desired operating conditions, more positive than the voltage at the source terminal 359 of the virtual P-channel MOSFET by an amount that depends on the maximum voltage to be applied between the gate terminal 310 and the source terminal 359 of the virtual P-channel MOSFET. For example, the voltage at node 361 should be preferably be eleven (11) volts more positive than the voltage at terminal 359 when the maximum voltage to be applied between terminals 310 and 359 is ten (10) volts.

Second, the voltage at node 363 should be sufficiently positive with respect to the drain terminal 357 of the virtual P-channel MOSFET to allow the voltage between the gate terminal 354 and the source terminal 353 of the N-channel MOSFET 307 to equal the voltage between the gate terminal 310 and the source terminal 359 of the virtual P-channel MOSFET. For example, the voltage at node 363 should be preferably eleven (11) volts more positive than the voltage at terminal 357 when the maximum voltage to be applied between terminals 310 and 359 is ten (10) volts.

Third, PNP transistor 319 should be kept from saturating. This requirement constrains the voltage at node 361 to be, under all desired operating conditions, more positive than the voltage at the drain terminal 357 of the virtual P-channel MOSFET by an amount that depends on the maximum voltage to be applied between the gate terminal 310 and the source terminal 359 of the virtual P-channel MOSFET. For example, the voltage at node 361 should be preferably be a minimum of twenty (20) volts more positive than the voltage at terminal 357 when the maximum voltage to be applied between terminals 310 and 359 is ten (10) volts.

Lastly, if PNP transistor 320 is utilized, it should also be kept from saturating. This requirement constrains the voltage at the base terminal 328 of PNP transistor 320 to be, under all desired operating conditions, more positive than the voltage at the drain terminal 357 of the virtual P-channel MOSFET and more negative than the voltage at node 361 by an amount that depends on the maximum voltage to be applied between the gate terminal 310 and the source terminal 359 of the virtual P-channel MOSFET. For example, the voltage at the base terminal 328 of PNP transistor 320 should preferably be at least ten (10) volts more positive than the voltage at terminal 357 and at least ten (10) volts more negative than the voltage at node 361 when the maximum voltage to be applied between terminals 310 and 359 is ten (10) volts.

Table 1 below is a parts listing for the preferred circuit 300 of FIG. 3.

TABLE 1

| Reference Numeral(s) | Part Description | Manufacturer | Manufacturer's Part Number |
| --- | --- | --- | --- |
| 311, 313, 321, 323 | 1000 □, ¼ Watt, 5% Resistor | Ohmite Manufacturing Company Skokie, IL | OD102J |
| 335 | 100 □, ¼ Watt, 5% Resistor | Ohmite Manufacturing Company Skokie, IL | OD101J |
| 337 | 4700 □, ¼ Watt, 5% Resistor | Ohmite Manufacturing Company Skokie, IL | 0D472J |
| 352 | 22 □, ¼ Watt, 5% Resistor | Ohmite Manufacturing Company Skokie, IL | OD220J |
| 309, 331, 333 | NPN Bipolar Junction Transistor | Fairchild Semiconductor Corporation So. Portland, ME | 2N3904 |

TABLE 1-continued

| Reference Numeral(s) | Part Description | Manufacturer | Manufacturer's Part Number |
| --- | --- | --- | --- |
| 319, 320, 329 | PNP Bipolar Junction Transistor | Fairchild Semiconductor Corporation So. Portland, ME | 2N3906 |
| 307 | N-channel Enhancement-Type MOSFET | International Rectifier Co. El Segundo, CA | 1RF540 |

As described above, the present invention encompasses a circuit 200, 300 that operates in a manner substantially complementary to an amplifying device 203, 307 included therein. Such a circuit 200, 300 effectively creates a "virtual" amplifying device that can be beneficially used in applications, such as stereo amplifier applications, that require or prefer a truly complementary pair of amplifying devices to perform the amplification function. In such applications, the virtual amplifying device implemented by the circuit 200, 300 is used in a complementary manner with the amplifying device 203, 307 contained in the circuit 200, 300. By using a VCVS 201 to drive the amplifying device 203, 307 in the circuit 200, 300 to thereby create the virtual amplifying device, the present invention provides a virtual amplifying device that very closely tracks, in a complementary manner, the amplifying device 203, 307 itself Therefore, when the virtual amplifying device 200, 300 and the amplifying device 203, 207 are configured as a complementary pair, performance variation of one device due to varying operating conditions (e.g., varying source voltages and currents) are offset by truly complementary performance variation in the other device to net a composite amplifier that achieves its intended performance notwithstanding such varying operating conditions.

By contrast, prior art techniques used to create a virtual amplifying device do not use a VCVS to drive the amplifying device. Consequently, when the prior art virtual amplifying device and the amplifying device are configured as a complementary pair, performance variation of one device due to varying operating conditions are not offset by truly complementary performance variation in the other device and, therefore, the composite prior art amplifier formed by the two devices does not achieve its intended performance in view of such varying operating conditions.

Figure 4:
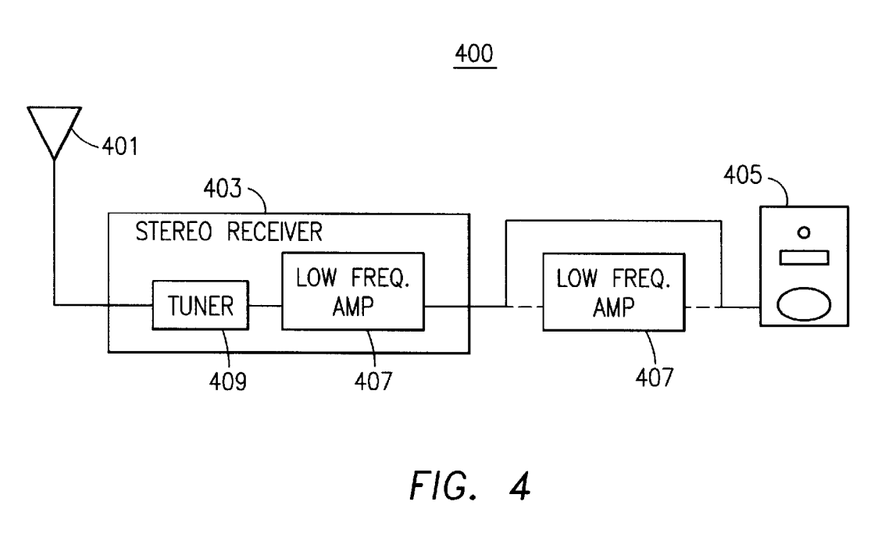
FIG. 4 is a block diagram of a stereo system that incorporates the circuit of FIG. 2 or FIG. 3 in accordance with the present invention.

FIG. 4 is a block diagram of a stereo system 400 that incorporates the circuit of either FIG. 2 or FIG. 3 in accordance with the present invention. The stereo system 400 includes an antenna 401, a stereo receiver 403, at least one speaker 405, and a low frequency power amplifier 407. Depending on the particular configuration of the stereo system 400, the stereo receiver 403 might include a tuner 409 and a low frequency power amplifier 407 or might include the tuner 409 and some small signal amplifiers. In either configuration, the stereo system 400 might further include a low frequency power amplifier 407 coupled between the stereo receiver 403 and the speaker 405. All of the elements of the stereo system 400 are well known, except that the low frequency power amplifier 407 includes a circuit 200, 300 as described above with respect to FIG. 2 or FIG. 3.

Operation of the stereo system 400 occurs substantially as follows in accordance with the present invention. Radio signals (e.g., FM radio signals in the 88–108 MHz band) are received by the antenna 401 and provided to the stereo receiver 403. The tuner 409 of the stereo receiver 403 selects one of the radio signals to be received, downconverts and demodulates the selected signal, and provides the demodulated signal as an input signal to an interface (not shown), such as a cable interface or a printed circuit board trace, of the low frequency amplifier 407. The input signal provided to the low frequency amplifier 407 preferably has a frequency in the audio range of twenty (20) Hz to one hundred (100) kHz. The low frequency amplifier 407, which includes an amplifier circuit that preferably incorporates the circuit 200, 300 of either FIG. 2 or FIG. 3 in a complementary configuration with the respective amplifying device 203, 307 of the circuit 200, 300, amplifies the input signal in accordance with known techniques and provides the amplified signal to either another low frequency amplifier 407 for further amplification or to the speaker 405 for audible display to a user of the system 400.

Use of the circuit 200, 300 of FIG. 2 or FIG. 3 in the low frequency amplifier 407 of the stereo system 400 enables the low frequency amplifier 407 to perform consistently well over specified operating conditions, particularly when the low frequency amplifier 407 includes an amplifier circuit that incorporates a complementary pair of amplifying devices (e.g., one amplifying device being a virtual amplifying device implemented using the circuit 200, 300 of FIG. 2 or FIG. 3 and the other amplifying device being the respective amplifying device 203, 307 used in the virtual amplifying device). Because the virtual amplifying device 200, 300 is a true complement of the actual amplifying device 203, 307 (i.e., uses a VCVS 201 to drive the same amplifying device 203, 307 as the actual amplifying device 203, 307), varying operating conditions, such as varying operating voltages and currents due to changes in ambient temperature, do not degrade performance of the complementary pair, in contrast to prior art complementing techniques which do not use a VCVS to drive the amplifying device in the virtual amplifying device circuit.

Although application of the virtual amplifying device circuit 200, 300 was discussed above primarily with respect the circuit's use in low frequency audio equipment, the circuit 200, 300 may also be used in high frequency applications (e.g., up to about ten (10) MHz) and/or may be incorporated into an integrated circuit amplifier for use in high or low frequency applications.

While the foregoing constitute certain preferred and alternative embodiments of the present invention, it is to be understood that the invention is not limited thereto and that in light of the present disclosure, various other embodiments will be apparent to persons skilled in the art. Accordingly, it is to be recognized that changes can be made without departing from the scope of the invention as particularly pointed out and distinctly claimed in the appended claims which shall be construed to encompass all legal equivalents thereof.

What is claimed is:

1. A circuit comprising:
   a voltage controlled voltage source (VCVS) having a positive input terminal, a negative input terminal, a positive output terminal, and a negative output terminal; and
   a three-terminal amplifying device having a first terminal coupled to the positive output terminal of the VCVS, a second terminal connected to the positive input terminal of the VCVS, and a third terminal coupled to the negative output terminal of the VCVS;
   whereby when a voltage is applied between the negative input terminal of the VCVS and the second terminal of the amplifying device, the circuit operates in a manner substantially complementary to the amplifying device.

2. The circuit of claim 1, wherein the amplifying device is an N-channel metal oxide semiconductor field effect transistor (MOSFET), wherein the first terminal of the amplifying device is a gate terminal of the N-channel MOSFET, wherein the second terminal of the amplifying device is a drain terminal of the N-channel MOSFET, wherein the third terminal of the amplifying device is a source terminal of the N-channel MOSFET, and wherein the circuit operates in a manner similar to a P-channel MOSFET.

3. The circuit of claim 1, wherein the VCVS has a voltage gain of approximately one.

4. The circuit of claim 1, wherein the amplifying device is one of an insulated gate bipolar transistor, a vacuum tube, a bipolar junction transistor, and a metal oxide semiconductor field effect transistor.

5. The circuit of claim 1, wherein the VCVS comprises:
   a differential amplifier having a first input terminal, a second input terminal, and an output terminal, wherein the first input terminal of the differential amplifier corresponds to the positive input terminal of the VCVS and wherein the second input terminal of the differential amplifier corresponds to the negative input terminal of the VCVS;
   a signal translation amplifier having an input terminal and an output terminal, wherein the input terminal of the signal translation amplifier is coupled to the output terminal of the differential amplifier; and
   an amplifying device driver circuit having an input terminal and two output terminals, wherein the input terminal of the amplifying device driver circuit is coupled to the output terminal of the signal translation amplifier, wherein a first output terminal of the amplifying device driver circuit corresponds to the negative output terminal of the VCVS, and wherein a second output terminal of the amplifying device driver circuit corresponds to the positive output terminal of the VCVS.

6. The circuit of claim 5, further comprising a resistor coupled between the second output terminal of the amplifying device driver circuit and the first terminal of the amplifying device, the resistor operating to decrease the bandwidth of the circuit and to reduce parasitic oscillations of the amplifying device.

7. The circuit of claim 5, wherein the differential amplifier comprises:
   an NPN bipolar junction transistor having a base terminal, an emitter terminal, and a collector terminal;
   a first resistor coupled between the emitter terminal of the NPN bipolar junction transistor and the second input terminal of the differential amplifier; and
   a second resistor coupled between a direct current voltage source and the collector terminal of the NPN bipolar junction transistor;
   wherein the collector terminal of the NPN bipolar junction transistor corresponds to the output terminal of the differential amplifier and wherein the base terminal of the NPN bipolar junction transistor corresponds to the first input terminal of the differential amplifier.

8. The circuit of claim 5, wherein the signal translation amplifier comprises:
   an PNP bipolar junction transistor having a base terminal, an emitter terminal, and a collector terminal;
   a first resistor coupled between the emitter terminal of the PNP bipolar junction transistor and a direct current voltage source; and a second resistor coupled to the collector terminal of the PNP bipolar junction transistor and the third terminal of the amplifying device;

wherein the base terminal of the PNP bipolar junction transistor corresponds to the input terminal of the signal translation amplifier and wherein the collector terminal of the PNP bipolar junction transistor corresponds to the output terminal of the signal translation amplifier.

9. The circuit of claim 8, wherein the signal translation amplifier further comprises a second PNP bipolar junction transistor coupled between the PNP bipolar junction transistor and the second resistor, the second PNP bipolar junction transistor including a base terminal, an emitter terminal, and a collector terminal, the emitter terminal of the second PNP bipolar junction transistor being coupled to the collector terminal of the PNP bipolar junction transistor, the collector terminal of the second PNP bipolar junction transistor being coupled to the second resistor, and the base terminal of the second PNP bipolar junction transistor being coupled to one of a second direct current voltage source and ground, wherein the collector terminal of the second PNP bipolar junction transistor corresponds to the output terminal of the signal translation amplifier.

10. The circuit of claim 5, wherein the amplifying device driver circuit comprises:
    a PNP bipolar junction transistor having a base terminal, an emitter terminal, and a collector terminal;
    a first NPN bipolar junction transistor having a base terminal, an emitter terminal, and a collector terminal, the emitter terminal of the first NPN bipolar junction transistor being coupled to the emitter terminal of the PNP bipolar junction transistor;
    a second NPN bipolar junction transistor having a base terminal, an emitter terminal, and a collector terminal, the base terminal of the second NPN bipolar junction transistor being coupled to the collector terminal of the first NPN bipolar junction transistor, the collector terminal of the second NPN bipolar junction transistor being coupled to a direct current voltage source, and the emitter terminal of the second NPN bipolar junction transistor being coupled to the base terminal of the first NPN bipolar junction transistor;
    a first resistor coupled between the emitter terminal of the PNP bipolar junction transistor and the emitter terminal of the second NPN bipolar junction transistor; and
    a second resistor coupled between the base terminal of the second NPN bipolar junction transistor and the direct current voltage source;
    wherein the base terminal of the PNP bipolar junction transistor corresponds to the input terminal of the amplifying device driver circuit, wherein the collector terminal of the PNP bipolar junction transistor corresponds to the first output terminal of the amplifying device driver circuit, and wherein the base terminal of the first NPN bipolar junction transistor corresponds to the second output terminal of the amplifying device driver circuit.

11. The circuit of claim 5, wherein each of the differential amplifier, the signal translation amplifier, and the amplifying device driver circuit has a voltage gain of approximately one.

12. A three-terminal circuit that operates in a manner similar to a P-channel metal oxide semiconductor field effect transistor (MOSFET), the circuit comprising:
    an N-channel MOSFET having a gate terminal, a drain terminal, and a source terminal; and
    a four-terminal voltage controlled voltage source (VCVS) having a negative input terminal, a positive input terminal connected to the drain terminal of the N-channel MOSFET, a positive output terminal coupled to the gate terminal of the N-channel MOSFET, and a negative output terminal coupled to the source terminal of the N-channel MOSFET;
    wherein the negative input terminal of the VCVS corresponds to a first terminal of the circuit, the drain terminal of the N-channel MOSFET corresponds to a second terminal of the circuit, and the source terminal of the N-channel MOSFET corresponds to a third terminal of the circuit.

13. The circuit of claim 12, wherein the VCVS has a voltage gain of approximately one.

14. The circuit of claim 12, wherein the VCVS comprises:
    a differential amplifier having a first input terminal, a second input terminal, and an output terminal, wherein the first input terminal of the differential amplifier corresponds to the positive input terminal of the VCVS and wherein the second input terminal of the differential amplifier corresponds to the negative input terminal of the VCVS;
    a signal translation amplifier having an input terminal and an output terminal, wherein the input terminal of the signal translation amplifier is coupled to the output terminal of the differential amplifier; and
    a MOSFET driver circuit having an input terminal and two output terminals, wherein the input terminal of the MOSFET driver circuit is coupled to the output terminal of the signal translation amplifier, wherein a first output terminal of the MOSFET driver circuit corresponds to the negative output terminal of the VCVS, and wherein a second output terminal of the MOSFET driver circuit corresponds to the positive output terminal of the VCVS.

15. The circuit of claim 14, further comprising a resistor coupled between the second output terminal of the MOSFET driver circuit and the gate terminal of the N-channel MOSFET, the resistor operating to decrease the bandwidth of the circuit and to reduce parasitic oscillations of the N-channel MOSFET.

16. The circuit of claim 14, wherein the differential amplifier comprises:
    an NPN bipolar junction transistor having a base terminal, an emitter terminal, and a collector terminal;
    a first resistor coupled between the emitter terminal of the NPN bipolar junction transistor and the second input terminal of the differential amplifier; and
    a second resistor coupled between a direct current voltage source and the collector terminal of the NPN bipolar junction transistor;
    wherein the collector terminal of the NPN bipolar junction transistor corresponds to the output terminal of the differential amplifier and wherein the base terminal of the NPN bipolar junction transistor corresponds to the first input terminal of the differential amplifier.

17. The circuit of claim 14, wherein the signal translation amplifier comprises:
    an PNP bipolar junction transistor having a base terminal, an emitter terminal, and a collector terminal;
    a first resistor coupled between the emitter terminal of the PNP bipolar junction transistor and a direct current voltage source; and
    a second resistor coupled between the collector terminal of the PNP bipolar junction transistor and the source terminal of the N-channel MOSFET;

wherein the base terminal of the PNP bipolar junction transistor corresponds to the input terminal of the signal translation amplifier and wherein the collector terminal of the PNP bipolar junction transistor corresponds to the output terminal of the signal translation amplifier.

18. The circuit of claim 17, wherein the signal translation amplifier further comprises a second PNP bipolar junction transistor coupled between the PNP bipolar junction transistor and the second resistor, the second PNP bipolar junction transistor including a base terminal, an emitter terminal, and a collector terminal, the emitter terminal of the second PNP bipolar junction transistor being coupled to the collector terminal of the PNP bipolar junction transistor, the collector terminal of the second PNP bipolar junction transistor being coupled to the second resistor, and the base terminal of the second PNP bipolar junction transistor being coupled to one of a second direct current voltage source and ground, wherein the collector terminal of the second PNP bipolar junction transistor corresponds to the output terminal of the signal translation amplifier.

19. The circuit of claim 14, wherein the MOSFET driver circuit comprises:
a PNP bipolar junction transistor having a base terminal, an emitter terminal, and a collector terminal;
a first NPN bipolar junction transistor having a base terminal, an emitter terminal, and a collector terminal, the emitter terminal of the first NPN bipolar junction transistor being coupled to the emitter terminal of the PNP bipolar junction transistor;
a second NPN bipolar junction transistor having a base terminal, an emitter terminal, and a collector terminal, the base terminal of the second NPN bipolar junction transistor being coupled to the collector terminal of the first NPN bipolar junction transistor, the collector terminal of the second NPN bipolar junction transistor being coupled to a direct current voltage source, and the emitter terminal of the second NPN bipolar junction transistor being coupled to the base terminal of the first NPN bipolar junction transistor;
a first resistor coupled between the emitter terminal of the PNP bipolar junction transistor and the emitter terminal of the second NPN bipolar junction transistor; and
a second resistor coupled between the base terminal of the second NPN bipolar junction transistor and the direct current voltage source;
wherein the base terminal of the PNP bipolar junction transistor corresponds to the input terminal of the MOSFET driver circuit, wherein the collector terminal of the PNP bipolar junction transistor corresponds to the first output terminal of the MOSFET driver circuit, and wherein the base terminal of the first NPN bipolar junction transistor corresponds to the second output terminal of the MOSFET driver circuit.

20. The circuit of claim 14, wherein each of the differential amplifier, the signal translation amplifier, and the MOSFET driver circuit has a voltage gain of approximately one.

21. A power amplifier comprising:
an interface for receiving an input signal; and
an amplifier circuit, coupled to the interface, for amplifying the input signal, wherein the amplifier circuit comprises:
a voltage controlled voltage source (VCVS) having a positive input terminal, a negative input terminal, a positive output terminal, and a negative output terminal; and
a three-terminal amplifying device having a first terminal coupled to the positive output terminal of the VCVS, a second terminal coupled to the positive input terminal of the VCVS, and a third terminal coupled to the negative output terminal of the VCVS;
whereby when the input signal is applied to the negative input terminal of the VCVS, the amplifier circuit operates in a manner substantially complementary to the amplifying device.

22. The power amplifier of claim 21, wherein the input signal has a frequency of not more than one hundred kilohertz.

23. A stereo receiver comprising:
a tuner for selecting an input signal to be received; and
a low frequency power amplifier, coupled to the tuner, wherein the low frequency power amplifier comprises:
a low frequency interface for receiving the input signal; and
an amplifier circuit, coupled to the low frequency interface, for amplifying the input signal, wherein the amplifier circuit comprises:
a voltage controlled voltage source (VCVS) having a positive input terminal, a negative input terminal, a positive output terminal, and a negative output terminal; and
a three-terminal amplifying device having a first terminal coupled to the positive output terminal of the VCVS, a second terminal coupled to the positive input terminal of the VCVS, and a third terminal coupled to the negative output terminal of the VCVS;
whereby when the input signal is applied to the negative input terminal of the VCVS, the amplifier circuit operates in a manner substantially complementary to the amplifying device.

24. The stereo receiver of claim 23, wherein the input signal has a frequency of not more than one hundred kilohertz.

* * * * *